(12) United States Patent
Matsuno

(10) Patent No.: US 6,411,144 B1
(45) Date of Patent: Jun. 25, 2002

(54) PHASE-LOCKED LOOP CIRCUIT

(75) Inventor: Narito Matsuno, Sapporo (JP)

(73) Assignee: Fujitsu Quantum Devices Limited, Yamanashi-ken (JP)

( * ) Notice: Subject to any disclaimer, the term of this patent is extended or adjusted under 35 U.S.C. 154(b) by 0 days.

(21) Appl. No.: 09/633,263

(22) Filed: Aug. 4, 2000

(30) Foreign Application Priority Data

Aug. 5, 1999  (JP) ............................................ 11-222838

(51) Int. Cl.[7] ................................................ H03L 7/06
(52) U.S. Cl. .................... 327/157; 331/25; 331/DIG. 2; 375/375
(58) Field of Search ................................ 327/156, 157, 327/158, 159; 331/1 A, 17, 25, DIG. 2; 375/371, 374, 375, 376

(56) References Cited

U.S. PATENT DOCUMENTS

| | | | | |
|---|---|---|---|---|
| 5,334,953 A | * | 8/1994 | Mijuskovic | 331/8 |
| 5,687,201 A | * | 11/1997 | McClellan et al. | 327/157 |
| 5,781,048 A | * | 7/1998 | Nakao et al. | 327/157 |
| 5,929,677 A | * | 7/1999 | Murata | 327/157 |
| 5,933,037 A | * | 8/1999 | Momtaz | 327/157 |
| 6,121,844 A | * | 9/2000 | Suzuki | 331/17 |

FOREIGN PATENT DOCUMENTS

| | | |
|---|---|---|
| JP | 54-130862 | 10/1979 |
| JP | 5-243992 | 9/1993 |
| JP | 7-264061 | 10/1995 |
| JP | 11-017538 | 1/1999 |

* cited by examiner

*Primary Examiner*—Terry D. Cunningham
*Assistant Examiner*—An T. Luu
(74) *Attorney, Agent, or Firm*—Arent Fox Kintner Plotkin & Kahn, PLLC

(57) ABSTRACT

An effective range for a control voltage to operate a VCO is set in order to prevent the VCO from operating in the reverse characteristic area. A monitoring circuit is provided for monitoring the control voltage. When the control voltage is out of the effective range, the monitoring circuit outputs a monitor signal and inputs it into a charge pump. When the charge pump receives the monitor signal it generates a fixed voltage. Thus, when the reference signal is not inputted, the control voltage is maintained within a prespecified voltage range and the VCO oscillates within a prespecified frequency range.

4 Claims, 16 Drawing Sheets

| LOGIC | |
|---|---|
| V 1 < CONTROL VOLTAGE < V 2 | : OUTPUT AT L LEVEL |
| CONTROL VOLTAGE < V 1, CONTROL VOLTAGE > V 2 | : OUTPUT AT H LEVEL |

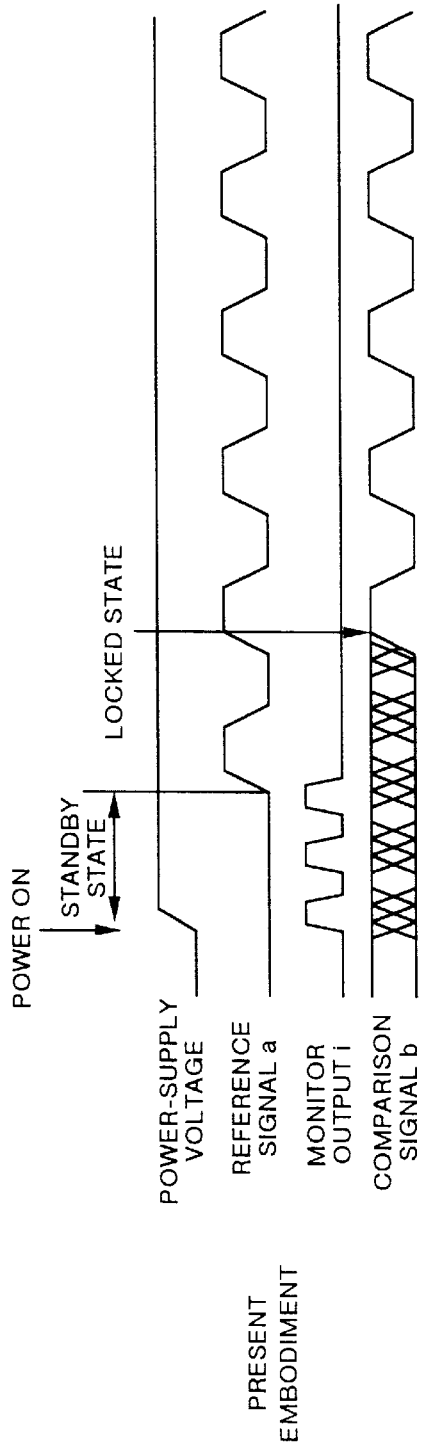
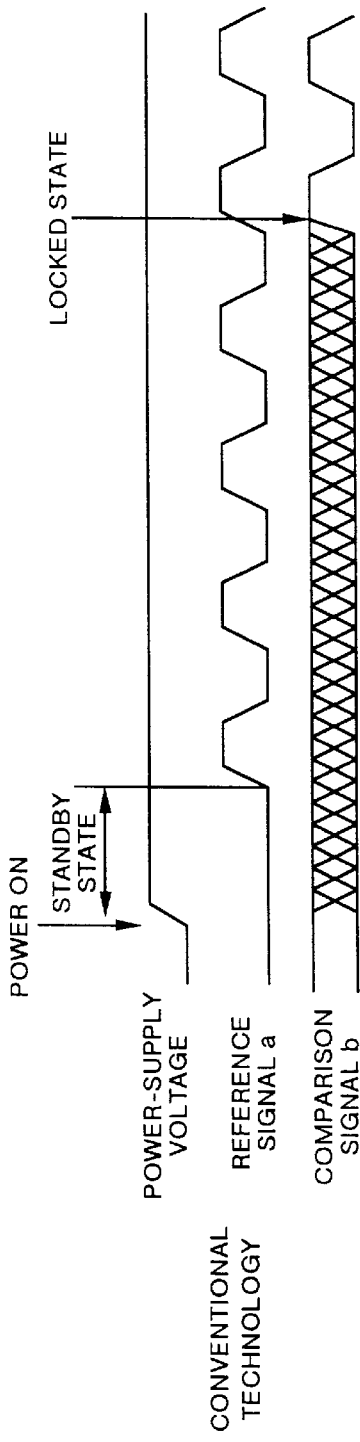

PHASE-LOCKED LOOP CIRCUIT

FIELD OF THE INVENTION

The present invention relates to a phase-locked loop (PLL) circuit. A voltage control oscillator (VCO) constituting the PLL circuit is so controlled that the oscillation frequency matches an input signal as the reference. The VCO oscillates irrespective of whether a signal is input or not when power is turned ON or in the standby state in which a signal is not inputted. Accordingly, a long time is required from input of the input signal till the locked state is effected. Sometimes, the locked state is not achieved, even when an input signal comes in, due to characteristics of the VCO. It is an object of the present invention to overcome the defects as described above.

BACKGROUND OF THE INVENTION

FIG. 10 is a block diagram that shows a general configuration of a PLL circuit. The PLL circuit comprises a phase/frequency comparator 11, a charge pump 12, a low-pass filter (LPF) 13, a voltage control oscillator (VCO) 14, and a frequency divider circuit 15. A reference signal a and a comparison signal b are inputted into the phase/frequency comparator 11. The phase/frequency comparator 11 compares the reference signal a with the comparison signal b in terms of phase and frequency. The phase/frequency comparator 11 outputs comparison difference signals c and d corresponding to the differences as the results of comparison. The charge pump 12 generates and outputs a pulse output e based on the comparison difference signals c and d outputted from the phase/frequency comparator 11.

The LPF 13 converts the pulse output e to an analog output voltage, and outputs the analog output voltage as control voltage f. The VCO 14 controls the oscillation frequency based on the control voltage f and outputs a frequency output signal g. The frequency divider circuit 15 outputs a signal obtained by dividing the frequency output signal g output by the VCO 14 as the comparison signal b to the phase/frequency comparator 11. Thus, in this PLL circuit, the phase/frequency comparator 11 always compares the reference signal a and the comparison signal b. A desired frequency output signal g is obtained by adjusting the control voltage f so that there is no difference between the two signals a and b.

The general processing sequence until the PLL circuit is locked is shown in FIG. 16 and FIG. 17. As shown in these figures, as the control voltage f is uncertain when power is turned ON or in the standby state where the reference signal a is not inputted, the control voltage f may sometimes rise up to the maximum level (power-supply voltage) or drop down to the minimum level (reference voltage). Therefore, since the oscillation frequency of the VCO 14 substantially deviates from the desired frequency, a long time is disadvantageously required before the locked state is effected.

The oscillation frequency of the VCO 14 generally rises in association with increase of the control voltage f. When the VCO 14 has reverse characteristics, that is, when the oscillation frequency drops in association with increase of the control voltage f at the upper or lower limit sides of the control voltage f, then, sometimes locking is not effected. In brief, as shown in FIG. 16, when the oscillation frequency of the VCO 14 drops in association with increase of the control voltage f in the upper limit side of the control voltage f, the control voltage f further increases in order to drop the oscillation frequency, and the control voltage f substantially deviates from that in the locked state. Similarly, the VCO 14 shows the same tendency in the lower limit side of the control voltage f, the control voltage f further decreases in order to raise the oscillation frequency, and in this case also the control voltage f substantially deviates from that in the locked state.

In order to overcome this problem, sometimes an adjustment circuit 16 is provided like in the PLL circuit shown in FIG. 11. As shown in FIG. 12, the adjustment circuit 16 comprises an inverter In1 into which a reset signal h is inputted as a reset signal, and a transistor Tr1 which turns ON in response to output from the inverter In1. When the reset signal h is inputted, the adjusting circuit 16 outputs a default voltage of prespecified amplitude to the LPF 13. This default voltage is outputted as the control voltage f from the LPF 13 to the VCO 14. Therefore, even if the VCO 14 operates with the tendency that the oscillation frequency drops in association with increase of the control voltage f, the control voltage f can be restored to a level close to that in the locked state by inputting the reset signal h.

In some other cases, a detection circuit 17 is provided like in the PLL circuit shown in FIG. 13 in order to shorten the time until the PLL circuit is locked. As shown in FIG. 14, the detection circuit 17 comprises a frequency comparator 18 and a charge pump 19. The frequency comparator 18 receives the reference signals a and the comparison signal b, and outputs the comparison difference signals m and n representing the difference between the earlier two signals. The charge pump 19 outputs a pulse output p based on the comparison difference signals m and n to the LPF 13. Thus, a voltage with prespecified amplitude is outputted as the control voltage f from the LPF 13 to the VCO 14. Therefore, the detection circuit 17 detects that a frequency difference between the reference signal a and comparison signal b is large and the control voltage f for the VCO 14 is adjusted in order to shorten the time required for locking.

FIG. 15 is a block diagram that shows a configuration of the frequency comparator 18 used in the detection circuit 17 shown in FIG. 14. The frequency comparator 18 comprises an edge detection circuit 181, a 90-degree delay circuit, six D flip flops FF1, FF2, FF3, FF4, FF5, FF6, an inverter In2, and four AND circuits An1, An2, An3, and An4.

However, the PLL circuit provided with the adjustment circuit 16 (see FIG. 11) can not be used at all in a circuit into which the reset signal h is not available. Therefore, the adaptability of such a PLL circuit to multi-purpose use is limited. Further, the logic of the frequency comparator 18 in the detection circuit 17 (see FIG. 13) is complicated. Therefore, circuit scale of the PLL circuit provided with the detection circuit 17 can not be small.

SUMMARY OF THE INVENTION

It is an object of the present invention to provide a PLL circuit which can be set in the locked state and also which normally operates even if a VCO used therein has the reverse characteristics.

In order to achieve the object described above, is a monitoring circuit provided in the PLL circuit according to the present invention. This monitoring circuit sets an effective range for a control voltage and monitors the control voltage. When the control voltage goes out of the effective range, the monitoring circuit sends a monitor signal to charge pump. Upon input of the monitor signal, the charge pump outputs a fixed voltage to the LPF. Thus, the VCO 24 is prevented from operating in the reverse characteristics area. Further, the VCO 24 oscillates in a prespecified frequency range in the state in which a reference signal is not inputted. As a consequence, the time required after a reference signal is inputted and until the locked state is effected is shortened.

Other objects and features of this invention will become apparent from the following description with reference to the accompanying drawings.

BRIEF DESCRIPTION OF THE DRAWINGS

FIG. 4A is a timing chart of the operations of the PLL circuit shown in FIG. 1 and FIG. 4B is a timing chart of the operations of a conventional PLL circuit;

DESCRIPTION OF THE PREFERRED EMBODIMENTS

A preferred embodiment of the present invention are described in detail below with reference to the related drawings.

Figure 1:
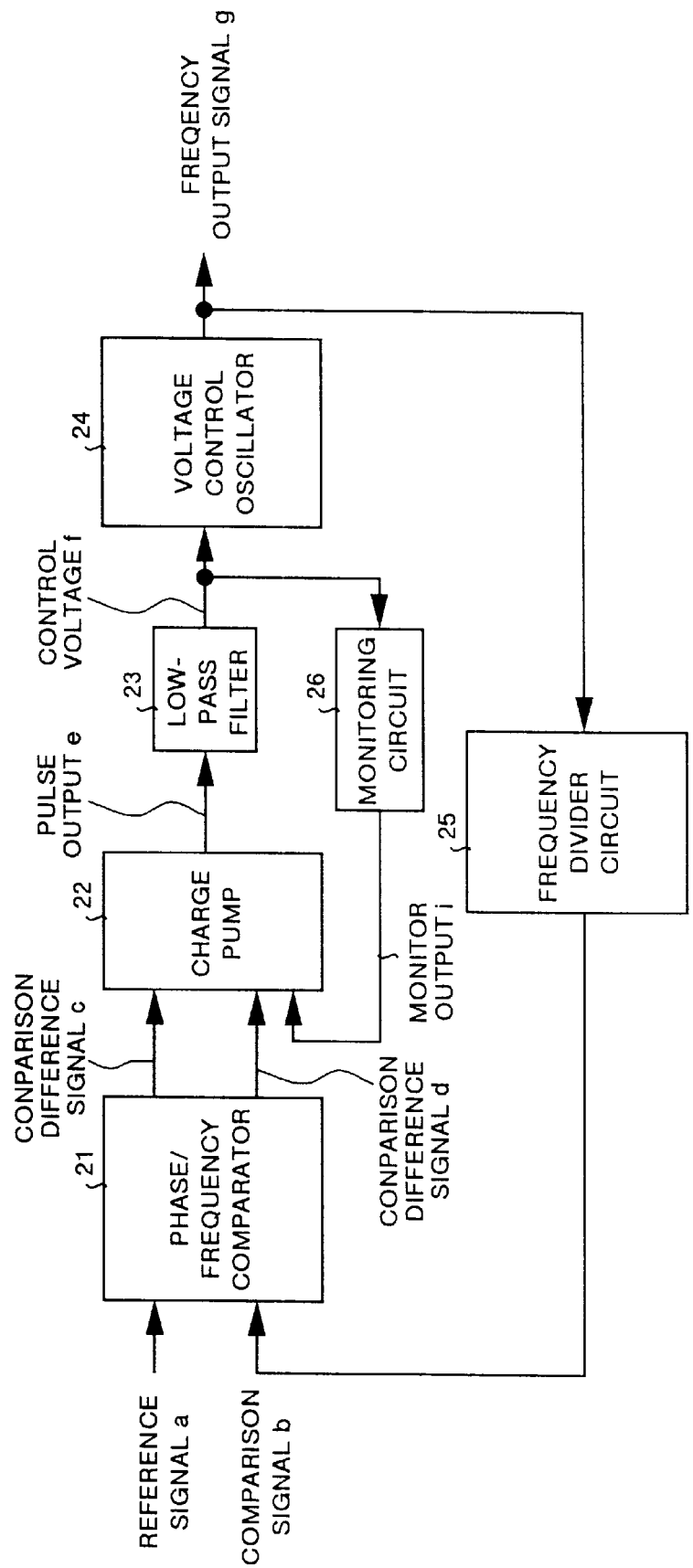
FIG. 1 is a block diagram that shows one example of the PLL circuit according to the present invention.

FIG. 1 shows one example of a PLL circuit according to the present invention. Like in the conventional technology, the PLL circuit comprises a phase/frequency comparator 21, a charge pump 22, a low-pass filter 23, a voltage control oscillator 24, and a frequency divider circuit 25. The PLL circuit according to this embodiment further comprises a monitoring circuit 26.

Figure 10:
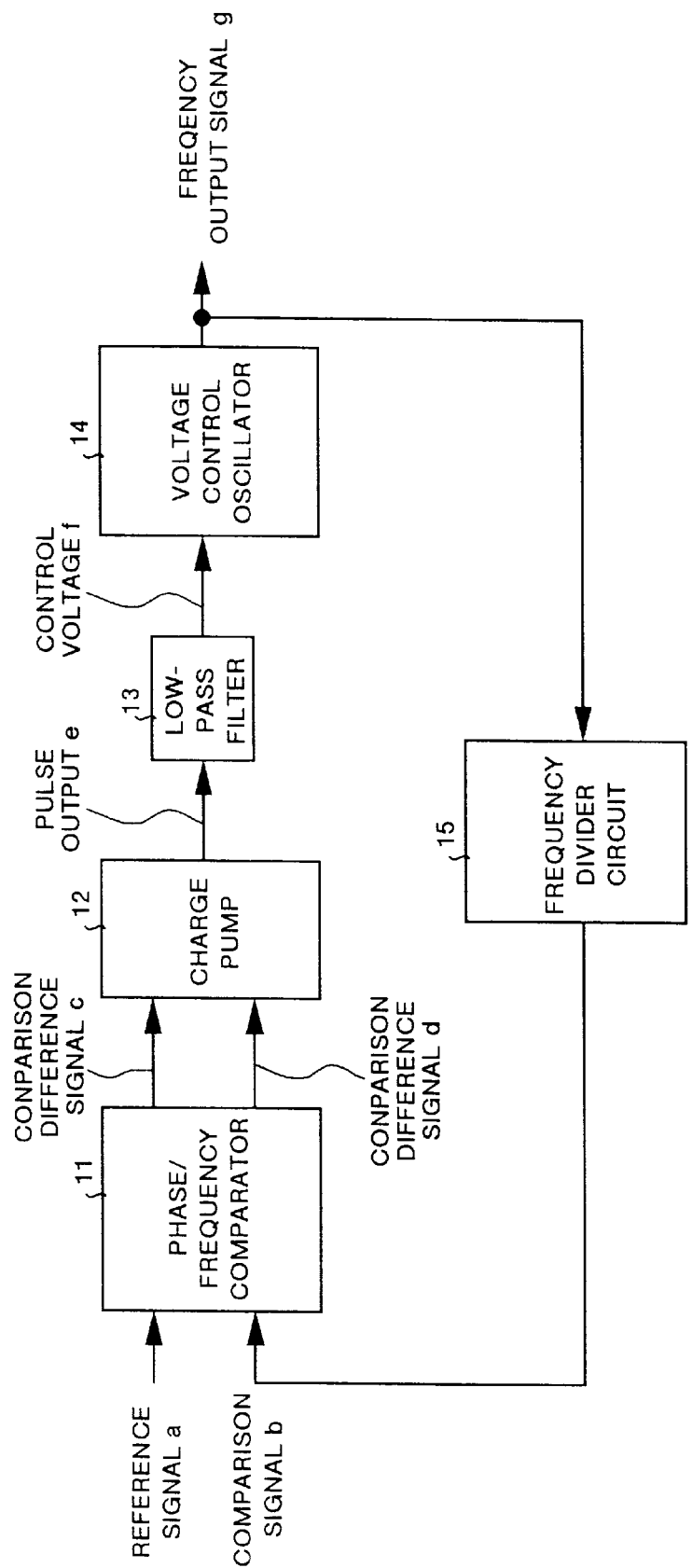
FIG. 10 is a block diagram showing a general PLL circuit.

The monitoring circuit 26 monitors a control voltage f inputted into the voltage control oscillator 24, and outputs a monitor output i to the charge pump 22 according to amplitude of the control voltage f. The phase/frequency comparator 21, low-pass filter 23, voltage control oscillator 24, and frequency divider circuit 25 are the same as those in the conventional technology shown in FIG. 10, so that description thereof is omitted herefrom. Different portions of the configuration from those in the conventional technology are described below.

Figures 2A, 2B:
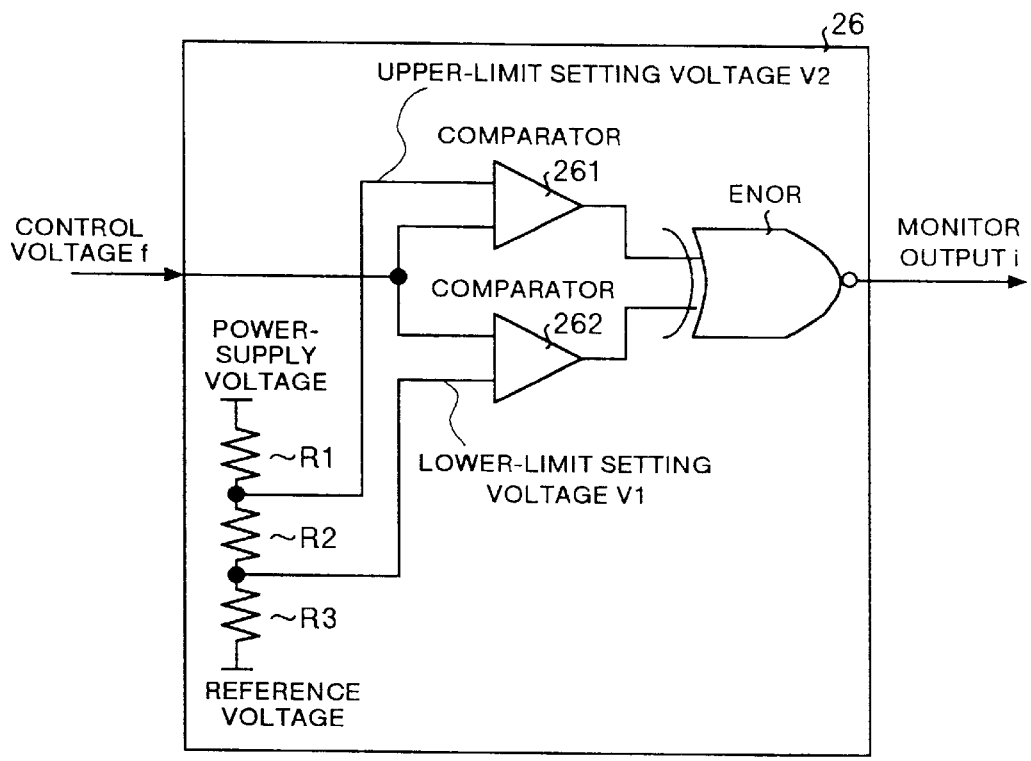
FIG. 2A is an example of the circuit configuration of the monitoring circuit used in the PLL circuit shown in FIG. 1 and FIG. 2B explains the logic.

FIG. 2A shows a circuit diagram of the monitoring circuit 26, and FIG. 2B explains the logic. The monitoring circuit 26 comprises, for instance, two comparators 261 and 262, an exclusive NOR circuit which outputs the monitor output i, and three resistors R1, R2, and R3.

The resistors R1, R2, and R3 are connected in series to each other between a power-supply voltage and a reference voltage. A lower-limit setting voltage V1 and an upper-limit setting voltage V2 for deciding a lower-limit value and an upper-limit value of the control voltage f respectively are decided by these resistors R1, R2, and R3. Although this should not be takes as a limitation, the resistance of the three resistors R1, R2, and R3 is same. Accordingly, the lower-limit setting voltage V1 and upper-limit setting voltage V2 are one third and two thirds of the power-supply voltage respectively.

The comparator 261 compares the control voltage f to the upper-limit setting voltage V2. The comparator 262 compares the control voltage f with the lower-limit setting voltage V1. Output signals from the comparators 261 and 262 are inputted into the exclusive NOR circuit ENOR. The exclusive circuit ENOR outputs the monitor output i.

Figure 3:
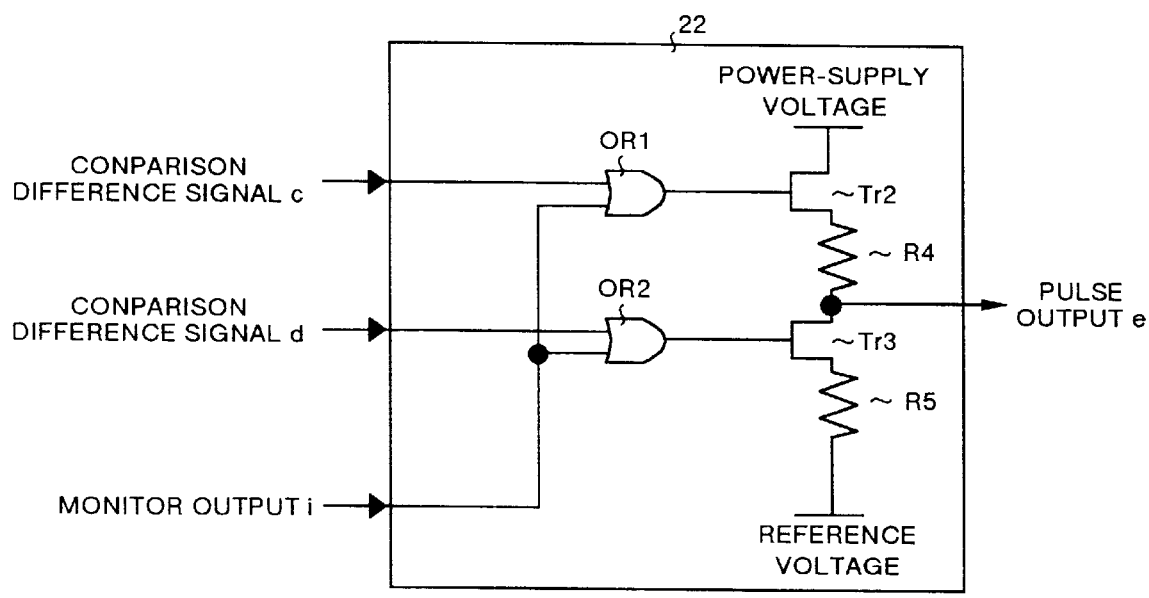
FIG. 3 is a circuit diagram showing one example of a charge pump used in the PLL circuit shown in FIG. 1.

FIG. 3 is a circuit diagram showing one example of the charge pump 22. The charge pump 22 comprises, for instance, two OR circuits OR1, OR2, two transistors Tr2, Tr3 each as a switching unit, and two resistors R4, R5. The OR circuit OR1 outputs OR between the comparison difference signal c outputted from the phase/frequency comparator 21 and the monitor output i outputted from the monitoring circuit 26. The transistor Tr2 is turned ON/OFF based on a signal output by the OR circuit OR1. The OR circuit OR2 outputs OR between the comparison difference signal d outputted from the phase/frequency comparator 21 and the monitor output i. The transistor Tr3 is turned ON or OFF based on a signal output by the OR circuit OR2.

The transistor Tr2, resistor R4, transistor Tr3, and resistor R5 are connected in series to each other between the power-supply voltage and the reference voltage, and constitutes a pump section. A pulse output e is outputted from a node between the resistor R4 and the transistor Tr3. Although this should not be taken as a limitation, the resistors R4 and R5 have the same resistances.

Operations of the PLL circuit are explained below. When the control voltage f is above the upper-limit setting voltage V2, output from the comparator 261 is set at high (H) level at which the electric potential is relatively high. When the control voltage f is below the upper-limit setting voltage V2, output from the comparator 261 is set at low (L) level at which the electric potential is relatively high. When the control voltage f is above the lower-limit setting voltage V1, output from the comparator 262 is set at high level. When the control voltage f is below the lower-limit setting voltage V1, output from the comparator 262 is set at low level.

When output levels of both the comparators 261 and 262 are at high level, namely when the control voltage f is above the upper-limit setting voltage V2, output of the ENOR, namely the monitor output i is at high level. Similarly, when the output levels of both the comparators 261 and 262 are at low level, namely when the control voltage f is below the lower-limit setting voltage V1 the monitor output i (output from the ENOR) is at high level.

When the monitor output i is at high level, the outputs of both the OR circuits OR1, OR2 are set high level. Therefore, both the transistors Tr2, Tr3 are turned ON, while a voltage level of the pulse output e takes a fixed value obtained by dividing the difference between the power-supply voltage and reference voltage by a sum of resistances of the resistors R4 and R5. Precisely, since the resistance value of the resistor R4 is the same as that of the resistor R5, and if the reference voltage is considered to be zero, the voltage level of the pulse output e is half of the power-supply voltage.

When the pulse output e fixed to half of the power-supply voltage is inputted, voltage level of the control voltage f outputted from the LPF 23 will also be half of the power-supply voltage. Thus, the power-supply voltage is below the upper-limit setting voltage V2 and above the lower-limit setting voltage V1. Therefore output level from the comparator 261 will be low level, and at the same time an output level from the comparator 262 will be high level. Accordingly, the monitor output i is set at low level. When the monitor output i is at low level, output levels of the OR circuits OR1 and OR2 in the charge pump 22 are decided by the comparison difference signals c and d outputted from the phase/frequency comparators 21.

When the comparison difference signal c is at high level and at the same time the comparison difference signal d is at low level, output levels of the OR circuits OR1 and OR2 will be high level and low level respectively. Therefore the transistor Tr2 is turned ON, while the transistor Tr3 is turned OFF. Accordingly, the electric charge accumulated in the LPF 23 will increase and the control voltage f will rise. However, when the control voltage f is rises above the upper-limit setting voltage V2, the monitor output i will be set at high level as described above, and the control voltage f outputted from the charge pump 22 is fixed to half of the power-supply voltage.

When the comparison difference signal c is at low level and at the same time the comparison difference signal d is at high level, output levels of the OR circuits OR1 and OR2 are will be low level and high level respectively. Therefore, the transistor Tr2 is turned OFF, while the transistor Tr3 is turned ON. Accordingly, the electric potential accumulated in the LPF 23 will decrease and the control voltage f will fall. However, when the control voltage f falls below the lower-limit setting voltage V1, the monitor output i will be set at high level as described above, and the control voltage f outputted from the charge pump 22 is fixed to half of the power-supply voltage.

When both the comparison difference signal c and comparison difference signal d are at high level, the output levels of the OR circuits OR1 and OR2 are set at high level. Therefore, both the transistors Tr2 and Tr3 will be turned ON, and a voltage level of the pulse output e will be fixed to half of the power-supply voltage. As a consequence, the control voltage f outputted from the charge pump 22 will also be half of the power-supply voltage.

When both the comparison difference signal c and comparison difference signal d are at low level, output levels of both the OR circuits OR1 and OR2 will be low level. Therefore, both the transistors Tr2 and Tr3 will be turned OFF. As a consequence, the control voltage f outputted from the charge pump 22 is maintained at half of the power-supply voltage.

Figure 5:
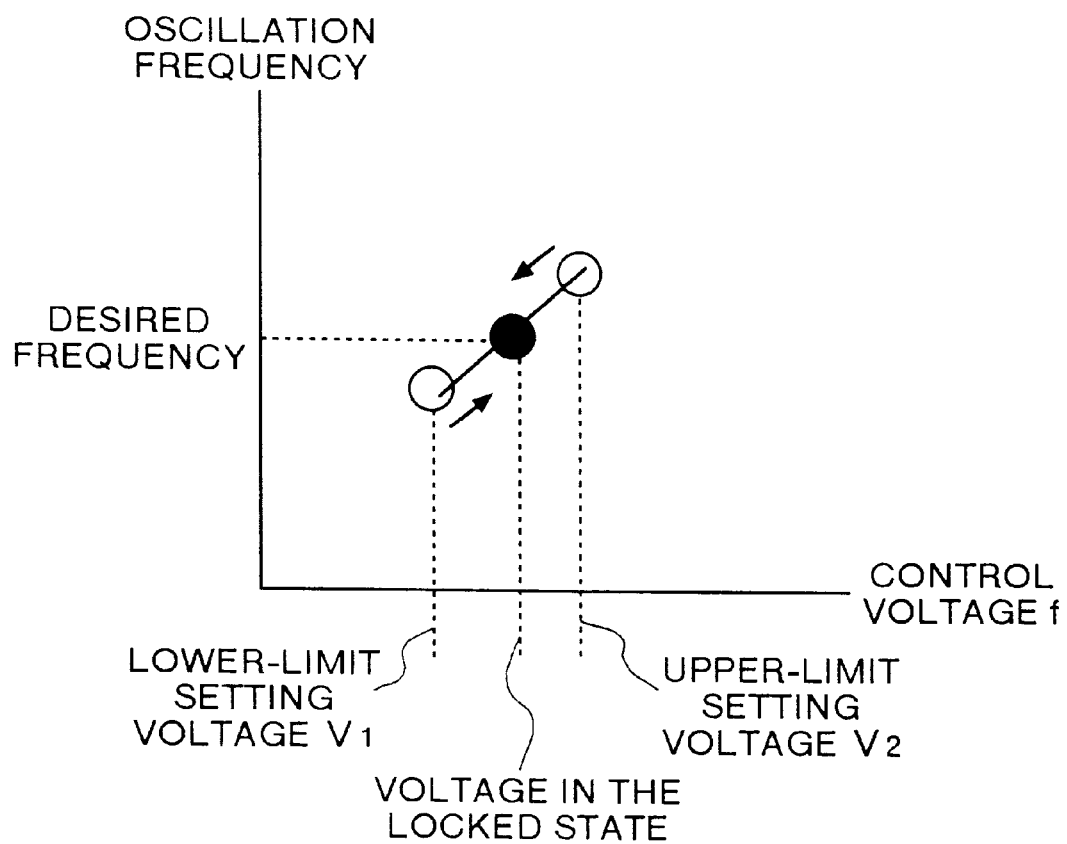
FIG. 5 shows the processing sequence until the PLL circuit shown in FIG. 1 is locked.

The PLL circuit according to this embodiment repeats any of the above-described operations until the reference signal a is inputted into the phase/frequency comparator 21. Therefore, as shown in the timing charts in FIG. 4A and FIG. 4B, the control voltage f is in a range from the lower-limit setting voltage V1 to the upper-limit setting voltage V2 after power is turned ON and until the reference signal a is inputted, and the VCO 24 oscillates within a frequency range corresponding to the above-described range. Thus, the locked state is effected within a shorter period of time as compared to that in the conventional technology from the time when the reference signal a is inputted. FIG. 5 shows the processing sequence until the PLL circuit according to the present invention is set in the locked state.

In this embodiment, the oscillation frequency g of the VCO 24 can vary only within the range corresponding to the lower-limit setting voltage V1 and the upper-limit setting voltage V2. Therefore, the time required after the reference signal a is inputted and until the locked state is effected can be shortened.

Figure 6:
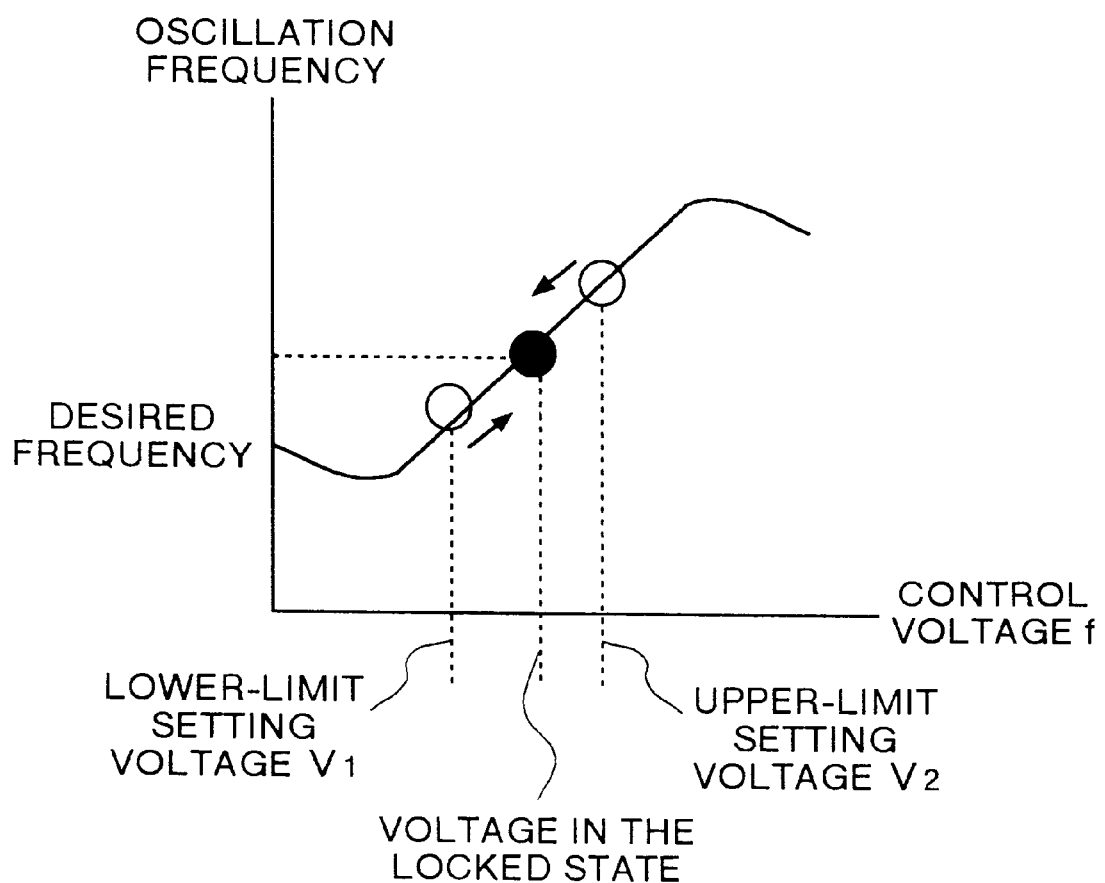
FIG. 6 shows the processing sequence until the PLL circuit shown in FIG. 1 is locked.

In this embodiment, as shown in FIG. 6, even if the VCO 24 has reverse characteristics in the upper limit side or in the lower limit side of the control voltage f, by setting the lower-limit setting voltage V1 and upper-limit voltage V2 in appropriate ranges respectively, it is possible to prevent the VCO 24 from operating in the reverse characteristic area. Therefore, the locked state can be effected quickly.

Figure 15:
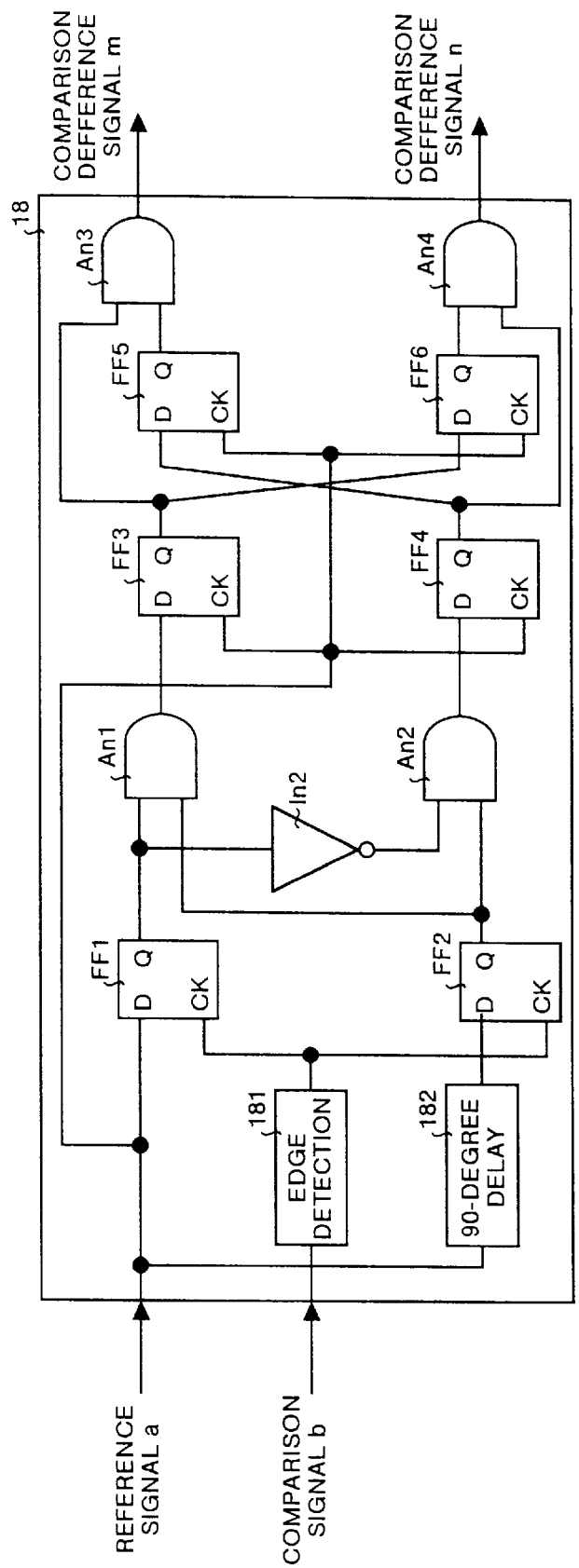
FIG. 15 is a block diagram showing a frequency comparator of the detection circuit shown in FIG. 14.
Figure 16:
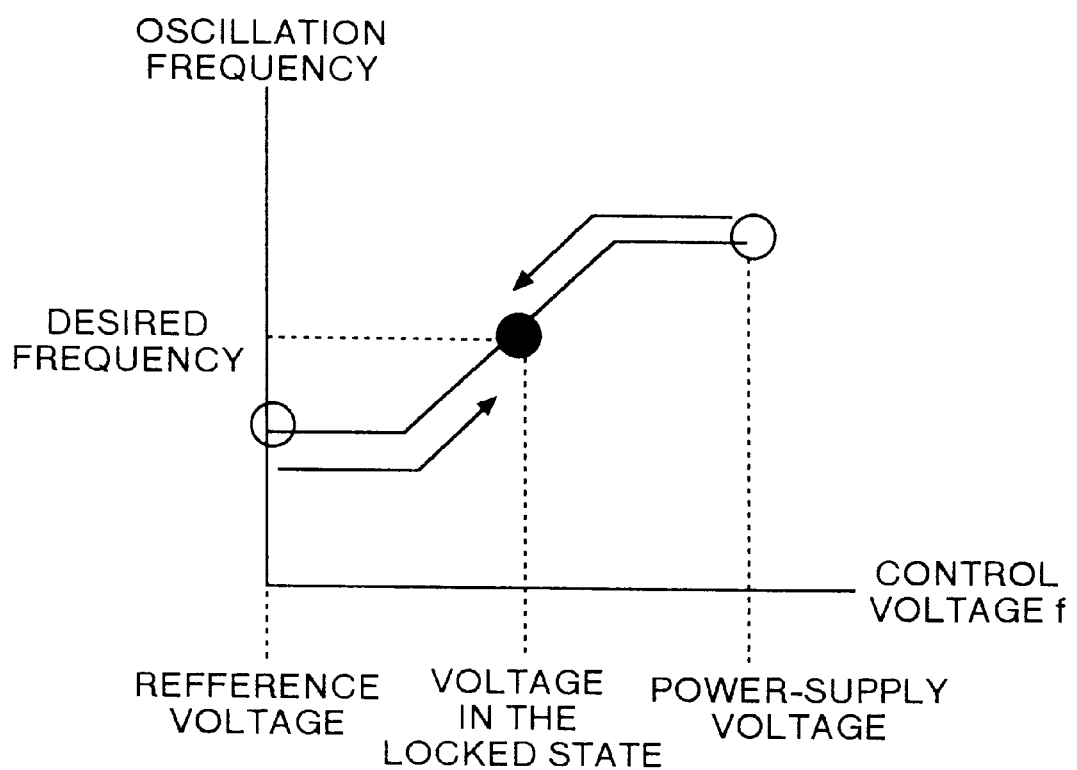
FIG. 16 shows the processing sequence until the PLL circuit is in general locked.
Figure 17:
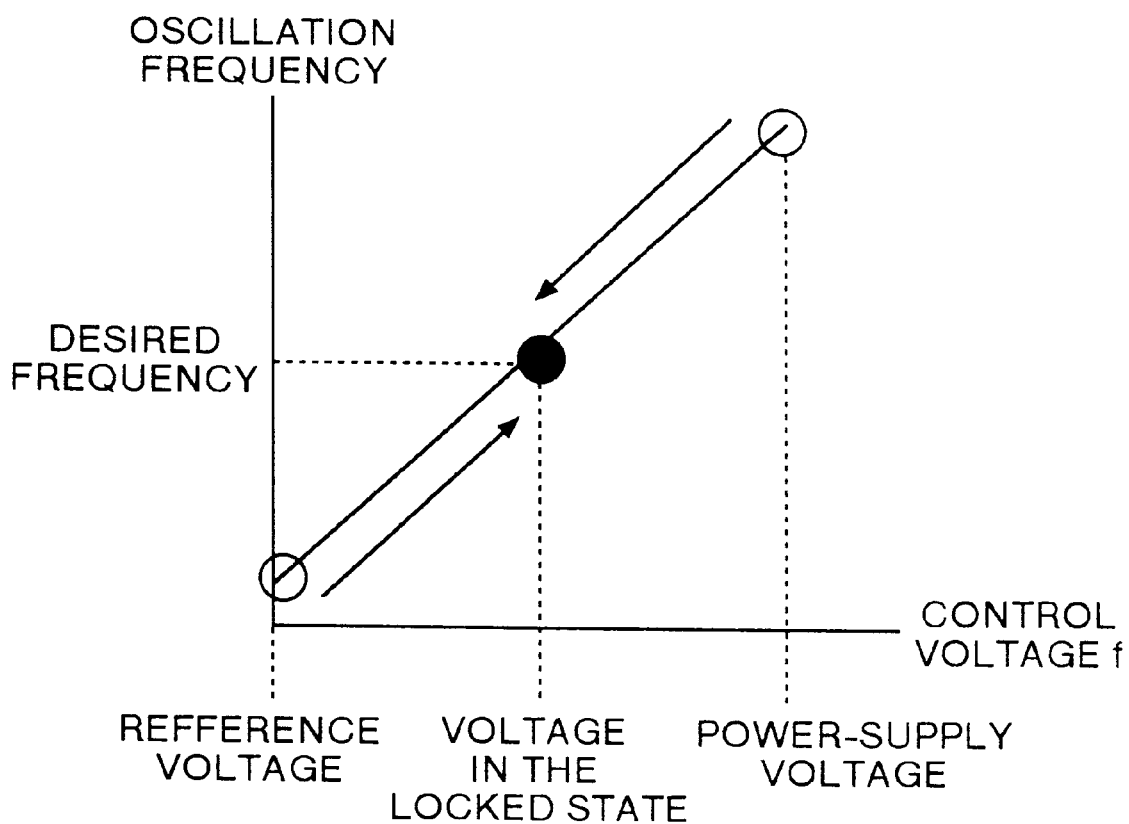
FIG. 17 shows the processing sequence until the PLL circuit is in general locked.

Further, in this embodiment, circuit scale of the monitoring circuit 26 is about half of the D flip-flop. The conventional type of circuit shown in FIG. 15 comprises six D flip-flops. Thus, the circuit scale of the monitoring circuit 26 is about one twelfth of the conventional circuit. Although two OR circuits OR1, OR2 are additionally provided in the charge pump 22, the scale of the OR circuit is still small. Thus, in this embodiment, a circuit having a substantially smaller size as compared to that based on the conventional technology is realized.

Figure 11:
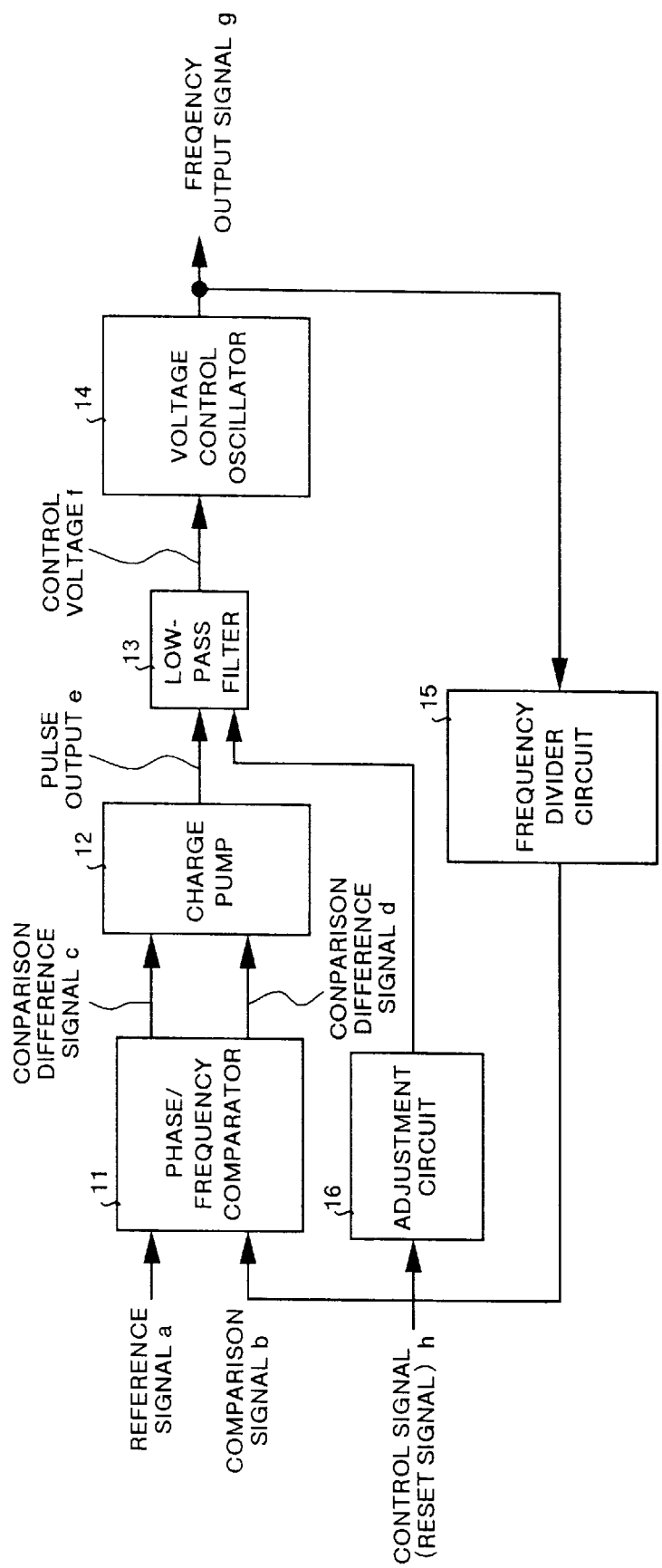
FIG. 11 is a block diagram showing one example of PLL circuit based on the conventional technology.
Figure 12:
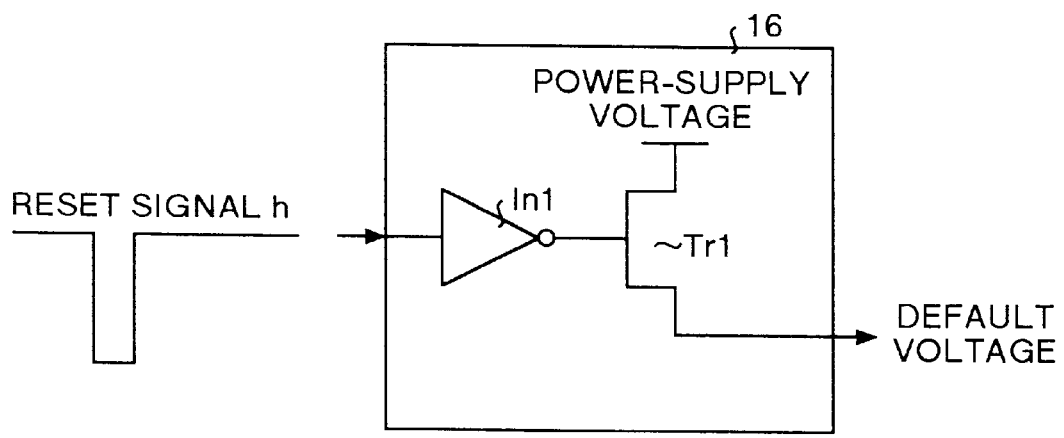
FIG. 12 is a circuit diagram showing an adjustment circuit used in the PLL circuit shown in FIG. 11.
Figure 13:
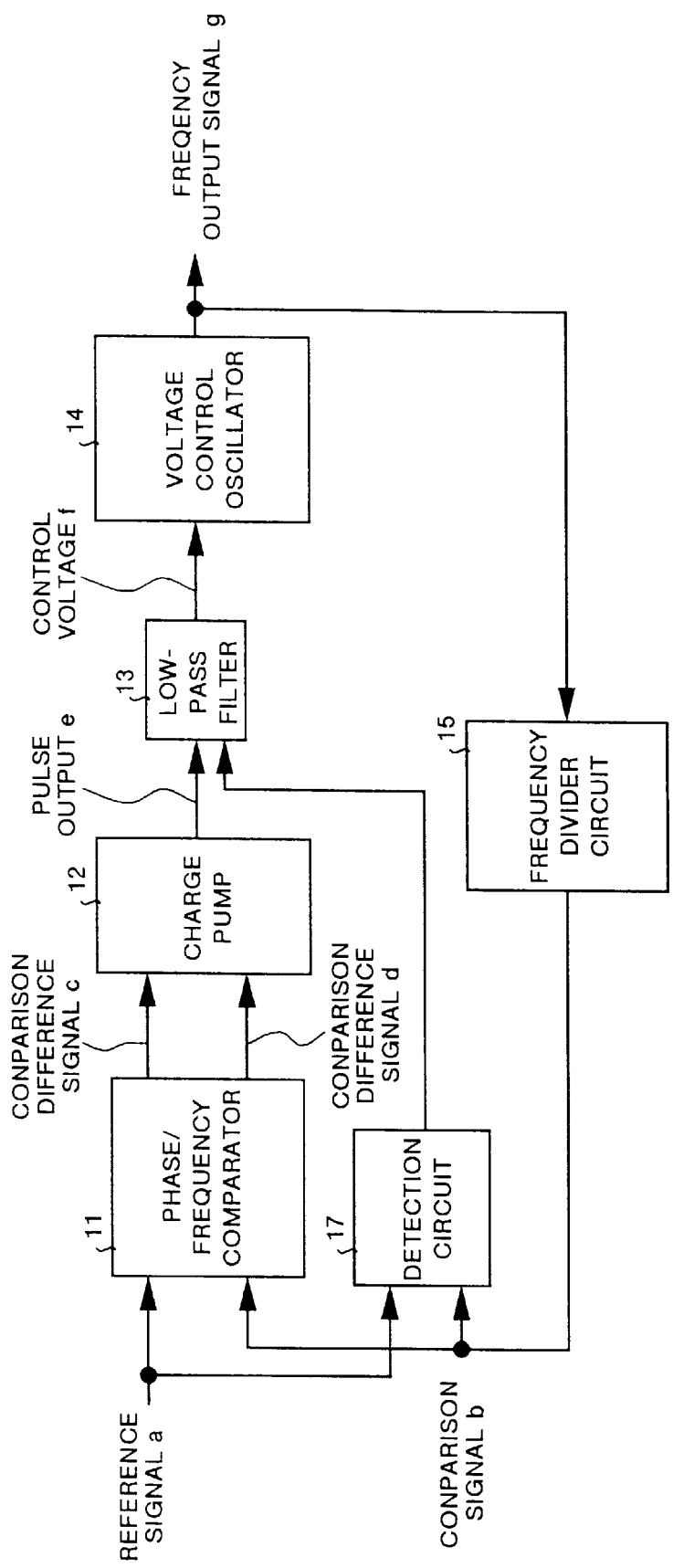
FIG. 13 is a block diagram showing another example of PLL circuit based on the conventional technology.
Figure 14:
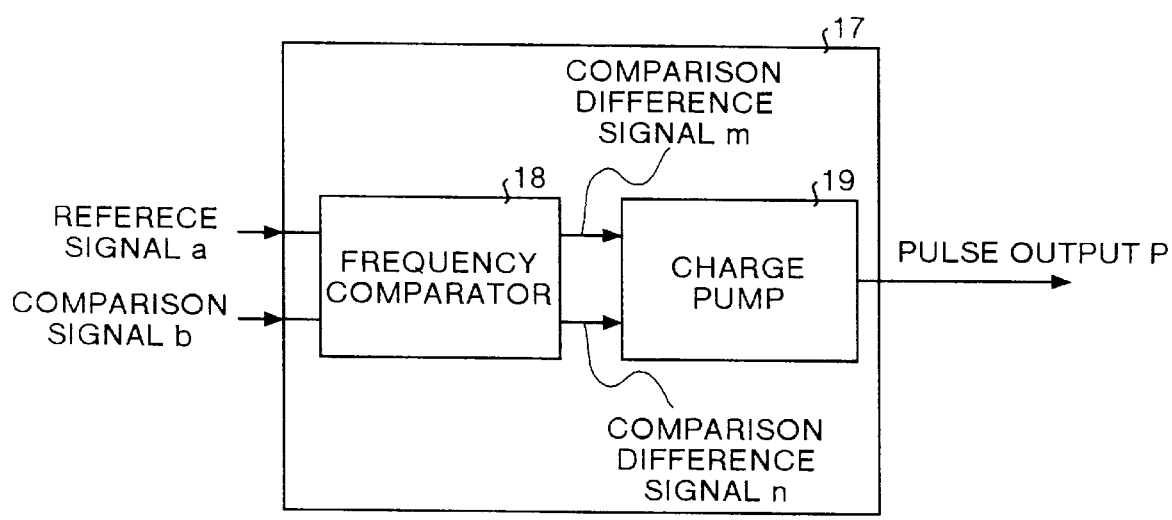
FIG. 14 is a block diagram showing a detection circuit used in the PLL circuit shown in FIG. 13.

Further, in this embodiment, reset signal required in the conventional type of PLL circuit shown in FIG. 11 is not necessary. Therefore, the PLL circuit can be applied also in a circuit in which a reset signal is not generated. Thus, the PLL circuit is adapted to multi-purpose use.

Figure 7:
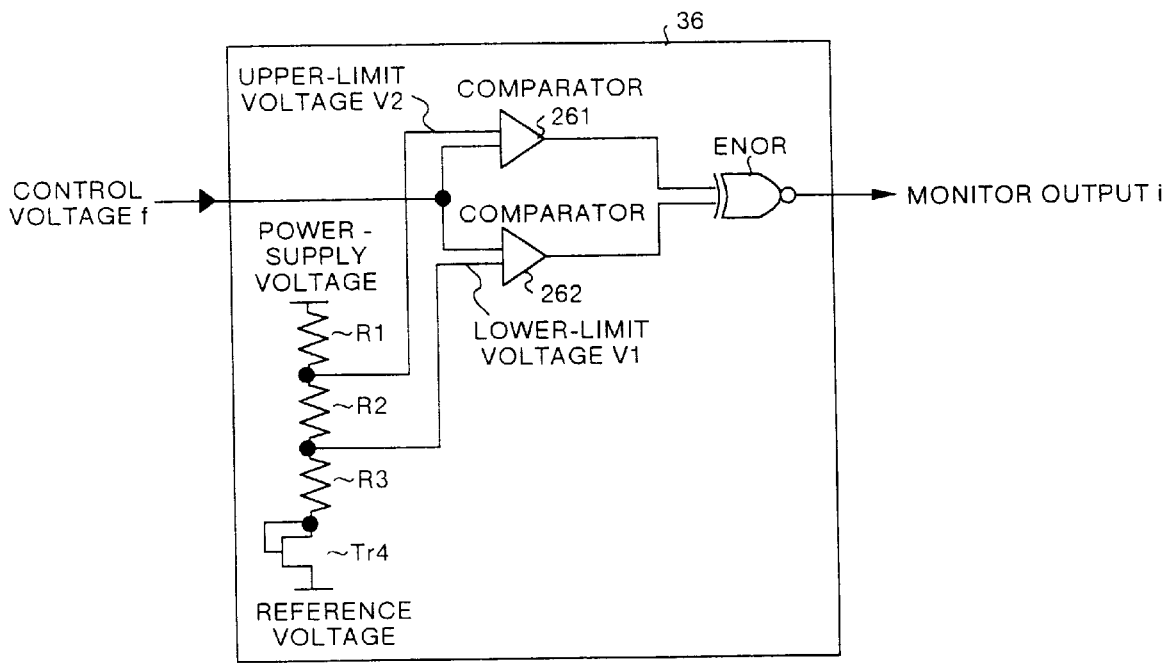
FIG. 7 is a circuit diagram showing another example of the monitoring circuit.

The present invention is not limited to the embodiment described above, and the design can be modified in various ways. For instance, as shown in FIG. 7, a monitoring circuit 36 in which a transistor Tr4 is connected as a diode to a section between the resistor R3 and reference voltage terminal. In this monitoring circuit 36, if the characteristics of the transistors (not shown) constituting the comparators 261, 262 change due to fluctuation in the power-supply voltage, fluctuation in atmospheric temperature, or differences in production process of the transistors, the characteristics of the transistor Tr4 also change in the same manner. If this monitoring circuit 36 is used, then, even if the lock voltage changes due to any of the causes as described above, the lower-limit setting voltage V1 and upper-limit setting voltage V2 change accordingly, so that the PLL circuit operates under stable conditions without being affected by the cause.

Figure 8:
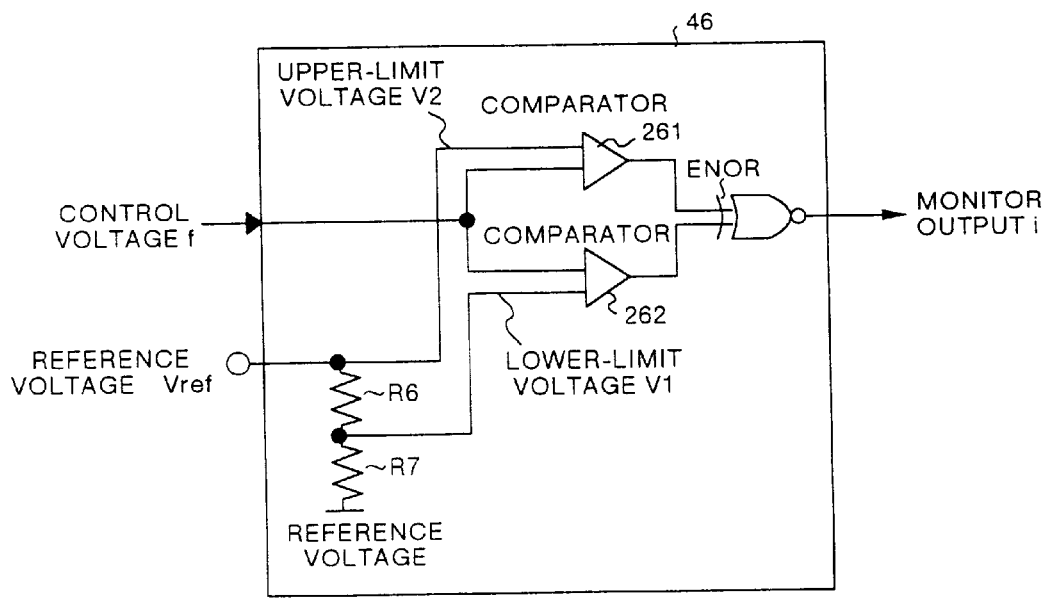
FIG. 8 is a circuit diagram showing still another example of the monitoring circuit.

Further, a monitoring circuit 46 shown in FIG. 8 may be used in place of the monitoring circuit 26. In this monitoring circuit 46, a reference voltage Vref not affected by changes in a power-supply voltage or atmospheric temperature as the upper-limit setting voltage V2 and a voltage obtained by dividing the references voltage Vref by a sum of resistance values of the two resistors R6, R7 as the lower-limit setting voltage V1 are inputted to the comparators 261, 262 respectively. When such monitoring circuit 46 is used, the lower-limit setting voltage V1 and upper-limit setting voltage V2 do not change, so that the PLL circuit can operate under stable conditions.

Figure 9:
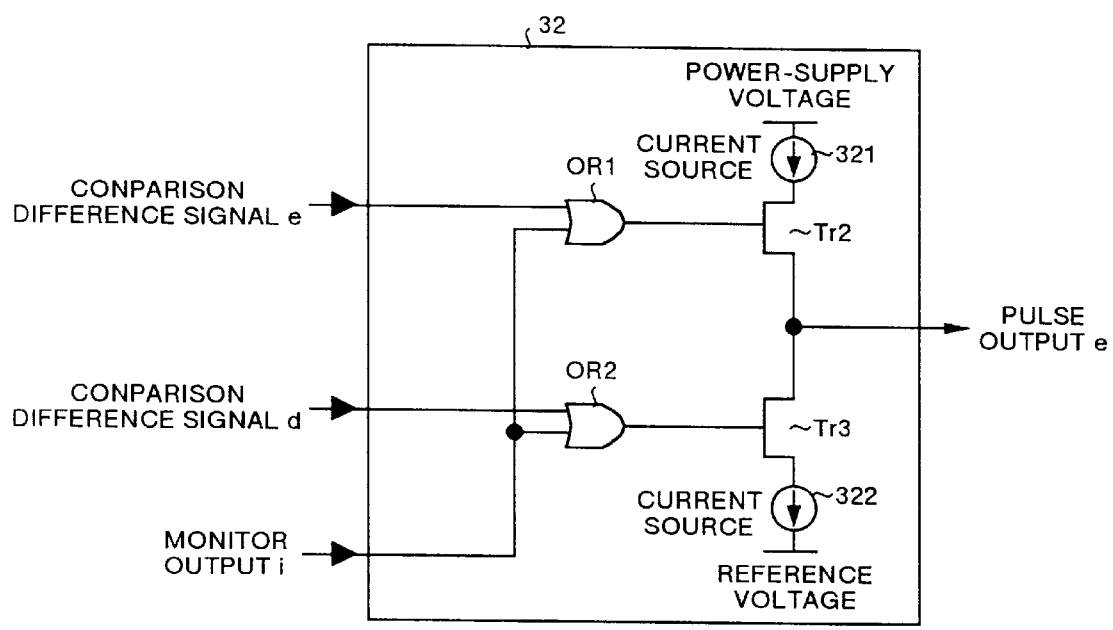
FIG. 9 is a circuit diagram showing another example of the charge pump.

Further, a charge pump 32 shown in FIG. 9 may be used in place of the charge pump 22. In this charge pump 32, a current source 321 is used to supply electric charge to the LPF 23, a current source 322 is used to discharge electric charge from the LPF 23, and current flows to the current sources 321, 322 are turned ON or OFF according to ON or OFF of the transistors Tr2 and Tr3 respectively. Influence of fluctuation in the power-supply voltage can be reduced by using this charge pump 32.

According to the present invention, the control voltage for controlling the oscillation frequency of the VCO is kept within a prespecified voltage range during a period when the reference signal is not input. Therefore, the time required after the input signal is inputted and until the locked state is effected can be reduced. Further, even if the VCO has reverse characteristics in the upper-limit side or in the lower-limit side, it is possible to prevent the VCO from operating in the reverse characteristic area, so that the VCO operates normally.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A phase-locked loop circuit comprising:
    a phase/frequency comparator which receives a comparison signal and a reference signal, compares the phase and frequency of the comparison signal and the phase and frequency of the reference signal respectively, and outputs two comparison difference signals representing a difference between the phase and frequency of the comparison signal and the reference signal;
    a charge pump which receives the two comparison difference signals and a monitor signal, and outputs a pulse signal for controlling a control voltage based on the two comparison difference signals or based on whether the monitor signal has a level higher than a prespecified level;
    a low-pass filter which receives the pulse signal and outputs the control voltage based on the pulse signal;
    a monitoring circuit which receives the control voltage, checks whether the control voltage is within a prespecified voltage range, and outputs the monitor signal having the level higher than the prespecified level and inputs it into said charge pump during a period when the control voltage is out of the prespecified voltage range;
    a voltage control oscillator which receives the control voltage, oscillates based on the control voltage, and outputs a frequency output signal; and
    a frequency divider which receives the frequency output signal, divides the frequency of the frequency output signal, and outputs the frequency divided frequency output signal to said phase/frequency comparator as the comparison signal.

2. The phase-locked loop circuit according to claim 1, wherein said charge pump comprises,
    a first switching unit which turns ON based on a comparison difference signal for raising the control voltage or based on the monitor signal;
    a second switching unit which turns ON based on a comparison difference signal for lowering the voltage control or based on the monitor signal; and
    a pump unit which outputs a pulse signal for increasing an electric charge accumulated in said low-pass filter when only said first switching unit turns ON, outputs a pulse signal for decreasing the electric charge accumulated in said low-pass filter when only said second switching unit turns ON, and outputs a prespecified pulse signal when both of said first and said second switching units simultaneously turn ON.

3. A phase-locked loop circuit comprising:
    a phase/frequency comparator which receives a comparison signal and a reference signal, compares the phase and frequency of the comparison signal and the phase and frequency of the reference signal respectively, and outputs two comparison difference signals representing a difference between the phase and frequency of the comparison signal and the reference signal;
    a charge pump which receives the two comparison difference signals and a monitor signal, and outputs a pulse signal for controlling a control voltage based on the two comparison difference signals or based on the monitor signal;
    a low-pass filter which receives the pulse signal and outputs the control voltage based on the pulse signal;
    a monitoring circuit which receives the control voltage, checks whether the control voltage is within a prespecified voltage range, and outputs the monitor signal and inputs it into said charge pump when the control voltage is out of the prespecified voltage range;
    a voltage control oscillator which receives the control voltage, oscillates based on the control voltage, and outputs a frequency output signal; and
    a frequency divider which receives the frequency output signal, divides the frequency of the frequency output signal, and outputs the frequency divided frequency output signal to said a phase/frequency comparator as the comparison signal,
    wherein said monitoring circuit comprises, a first comparator which compares the control voltage with an upper-limit setting voltage that represents an upper limit of an effective range of the control voltage; and
    a second comparator which compares the control voltage with a lower-limit setting voltage that represents a lower limit of the effective range of the control voltage, and
    said monitoring circuit outputs the monitor signal based on the result of comparison by said first and said second comparators.

4. A phase-locked loop circuit comprising:
    a phase/frequency comparator which receives a comparison signal and a reference signal, compares the phase and frequency of the comparison signal and the phase and frequency of the reference signal respectively, and outputs two comparison difference signals representing a difference between the phase and frequency of the comparison signal and the reference signal;
    a charge pump which receives the two comparison difference signals and a monitor signal, and outputs a pulse signal for controlling a control voltage based on the two comparison difference signals or based on the monitor signal;
    a low-pass filter which receives the pulse signal and outputs the control voltage based on the pulse signal;
    a monitoring circuit which receives the control voltage, checks whether the control voltage is within a prespecified voltage range, and outputs the monitor signal and inputs it into said charge pump when the control voltage is out of the prespecified voltage range;

a voltage control oscillator which receives the control voltage, oscillates based on the control voltage, and outputs a frequency output signal; and a frequency divider which receives the frequency output signal, divides the frequency of the frequency output signal, and outputs the frequency divided frequency output signal to said a phase/frequency comparator as the comparison signal, wherein said monitoring circuit comprises, a voltage range setting unit for setting the prespecified voltage range; and memory for storing the prespecified voltage range.

* * * * *